United States Patent
Harashima et al.

(10) Patent No.: US 12,065,732 B2
(45) Date of Patent: Aug. 20, 2024

(54) FILM FORMING METHOD AND FILM FORMING APPARATUS

(71) Applicant: Tokyo Electron Limited, Tokyo (JP)

(72) Inventors: Masayuki Harashima, Nirasaki (JP); Yukio Sano, Nirasaki (JP); Michikazu Nakamura, Nirasaki (JP); Hirokatsu Kobayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 47 days.

(21) Appl. No.: 17/425,581

(22) PCT Filed: Jan. 27, 2020

(86) PCT No.: PCT/JP2020/002735
§ 371 (c)(1),
(2) Date: Jul. 23, 2021

(87) PCT Pub. No.: WO2020/158656
PCT Pub. Date: Aug. 6, 2020

(65) Prior Publication Data
US 2022/0098726 A1 Mar. 31, 2022

(30) Foreign Application Priority Data
Feb. 1, 2019 (JP) .................. 2019-017111

(51) Int. Cl.
*C23C 16/32* (2006.01)
*C23C 16/44* (2006.01)
*C23C 16/458* (2006.01)

(52) U.S. Cl.
CPC ........ *C23C 16/325* (2013.01); *C23C 16/4405* (2013.01); *C23C 16/4583* (2013.01)

(58) Field of Classification Search
None
See application file for complete search history.

(56) References Cited

U.S. PATENT DOCUMENTS 7,288,284 B2 * 10/2007 Li .................. C23C 16/4404
427/249.15
2012/0031330 A1 2/2012 Tsumori et al.

FOREIGN PATENT DOCUMENTS

| JP | 2005-320208 A | 11/2005 | |
|---|---|---|---|
| JP | 2009-135228 A | 6/2009 | |
| JP | 2009231530 A * | 10/2009 | ............ B08B 13/00 |

(Continued)

OTHER PUBLICATIONS

Machine Translation of WO2018185916A1, retrieved Sep. 12, 2023.*

*Primary Examiner* — David P Turocy
(74) *Attorney, Agent, or Firm* — Armstrong Teasdale LLP (57) ABSTRACT

A film forming method of forming a silicon carbide film on a substrate to be processed includes: forming the silicon carbide film on the substrate to be processed by loading a holder that holds the substrate to be processed into a processing container of a film forming apparatus to place the holder on a stage, and supplying a raw material gas into the processing container; and removing a reaction product, which has been adhered to a part other than the substrate to be processed during the forming the silicon carbide film, by loading a plate-shaped member having at least a surface formed by pyrolytic carbon into the processing container to place the plate-shaped member on the stage, and supplying a fluorine-containing gas into the processing container.

8 Claims, 4 Drawing Sheets

(56) References Cited

FOREIGN PATENT DOCUMENTS

| | | | | |
|---|---|---|---|---|
| JP | 2012-054528 A | | 3/2012 | |
| JP | 2015002292 A | * | 1/2015 | ......... C23C 16/4581 |
| JP | 2015-119107 A | | 6/2015 | |
| JP | 2016-100462 A | | 5/2016 | |
| JP | 2017-011102 A | | 1/2017 | |
| JP | 2017011102 A | * | 1/2017 | |
| KR | 2015052304 A | * | 5/2015 | ........... C23C 16/325 |
| WO | 2016113924 A1 | | 7/2016 | |
| WO | WO-2018043446 A1 | * | 3/2018 | ............. B08B 13/00 |
| WO | WO-2018185916 A1 | * | 10/2018 | ............. C30B 25/14 |

* cited by examiner

● : Graphite material coated with SiC  ▲ : Bulk material of pyrolytic carbon

Distance from edge of holder (mm)

FIG. 5

FILM FORMING METHOD AND FILM FORMING APPARATUS

CROSS-REFERENCE TO RELATED APPLICATIONS

This application is a National Stage Application of International Patent Application No. PCT/JP2020/002735, having an International Filing Date of Jan. 27, 2020, which claims the benefit of priority to Japanese Patent Application No. 2019-017111, filed Feb. 1, 2019, each of which is hereby incorporated by reference herein.

TECHNICAL FIELD

The present disclosure relates to a film forming method and a film forming apparatus.

BACKGROUND

Patent Document 1 discloses a film forming apparatus for forming a silicon carbide (SiC) film on a wafer through epitaxial growth. This film forming apparatus has a container having therein a space capable of being depressurized, and also has a rotary stage configured to hold and rotate a plurality of wafers in the container. In addition, in the film forming apparatus, the plurality of wafers is placed on a holder which is a substantially disk-shaped member. The holder is mounted on the rotary stage, and is formed by a graphite member coated with SiC.

PRIOR ART DOCUMENTS

Patent Documents

Patent Document 1: Japanese Laid-Open Patent Publication No. 2016-100462

A technique according to the present disclosure extends a lifespan of a member related to forming a SiC film and improves efficiency of cleaning an apparatus for forming the SiC film.

SUMMARY

An aspect of the present disclosure provides a film forming method of forming a silicon carbide film on a substrate to be processed. The film forming method includes: forming the silicon carbide film on the substrate to be processed by loading a holder that holds the substrate to be processed into a processing container of a film forming apparatus to place the holder on a stage, and supplying a raw material gas into the processing container; and removing a reaction product, which has been adhered to a part other than the substrate to be processed during the forming the silicon carbide film, by loading a plate-shaped member having at least the surface formed by pyrolytic carbon into the processing container to place the plate-shaped member on the stage, and supplying a fluorine-containing gas into the processing container.

According to the present disclosure, it is possible to extend a lifespan of a member related to forming a SiC film and to improve efficiency of cleaning an apparatus for forming the SiC film.

DETAILED DESCRIPTION

In recent years, SiC has been used for electronic devices such as a semiconductor power device. In manufacturing such an electronic device, a SiC film is formed on a SiC substrate through epitaxial growth, which grows, on a single crystalline substrate, a film having the same orientation as a crystal of the substrate.

As a film forming apparatus for forming a SiC film through epitaxial growth, an apparatus including a processing container configured such that an interior thereof is capable of being depressurized, and a stage, which is disposed in the processing container and on which a substrate to be processed is placed via a holder holding the substrate to be processed, is known. The processing container of the film forming apparatus is provided with a gas introduction port via which a raw material gas for film formation is introduced, and is connected to an exhaust device via an exhaust pipe such as an exhaust manifold.

In the film forming apparatus described above, unnecessary reaction products are adhered to parts other than the substrate to be processed, such as the stage and the exhaust pipe, during the film formation. When the reaction products are adhered as described above, stress may be generated in the parts to which the reaction products are adhered. In addition, unnecessary reaction products may grow in a dendritic form in a vicinity of the gas introduction port which also serves as a substrate loading and unloading port, and may come into contact with the substrate to be processed during automatic transfer of the substrate to be processed. Therefore, in order to remove the adhered unnecessary reaction products, conventionally, a method of periodically wiping or polishing or a method of supplying hydrogen while heating the stage has been adopted.

However, when the reaction products are removed through the periodic wiping or polishing as described above, dust may be generated and thus workability becomes poor. Further, in the method of removing the reaction products through wiping or the like, a time necessary for a work including cooling the processing container is lengthened, resulting in a long apparatus downtime.

In addition, in a case where the reaction products are removed by supplying hydrogen while heating the stage as described above, the reaction products cannot be removed sufficiently.

Therefore, a method of supplying a fluorine-containing gas, such as $ClF_3$ gas, may be considered as a method of removing unnecessary reaction products, that is, a method of cleaning a film forming apparatus.

In such a method of supplying a fluorine-containing gas, it is necessary to place a holder or the like on a stage in order to protect the stage from the fluorine-containing gas, which is a highly reactive gas. By placing the holder, the holder can be also cleaned.

However, in a case where the holder is a graphite member coated with SiC as in Patent Document 1, the coated SiC may be removed by the fluorine-containing gas for cleaning, and the underlying graphite portion may be damaged.

In addition, instead of the holder, it may also be considered to place a plate-shaped member for cleaning only, which is formed by a bulk material of SiC, on the stage. However, in this case, since the plate-shaped member is etched together with the unnecessary reaction products by the fluorine-containing gas, a lifespan of the plate-shaped member is shortened. In addition, in this case, since the fluorine-containing gas is consumed at a portion that does not need to be etched, efficiency of cleaning becomes poor. Furthermore, in this case, since the fluorine-containing gas is consumed at the portion that does not need to be etched, a total amount of the cleaning gas increases, and thus members on an upstream side of the stage are damaged significantly. Therefore, lifespans of the members on the upstream side are shortened.

A technique according to the present disclosure extends a lifespan of a member related to forming a SiC film and improves efficiency of cleaning an apparatus for forming the SiC film.

Hereinafter, a film forming method and a film forming apparatus according to embodiments of the present disclosure will be described with reference to the drawings. In the specification and drawings, elements having substantially the same functional configurations will be denoted by the same reference numerals and redundant explanations will be omitted.

First Embodiment

Figure 1:
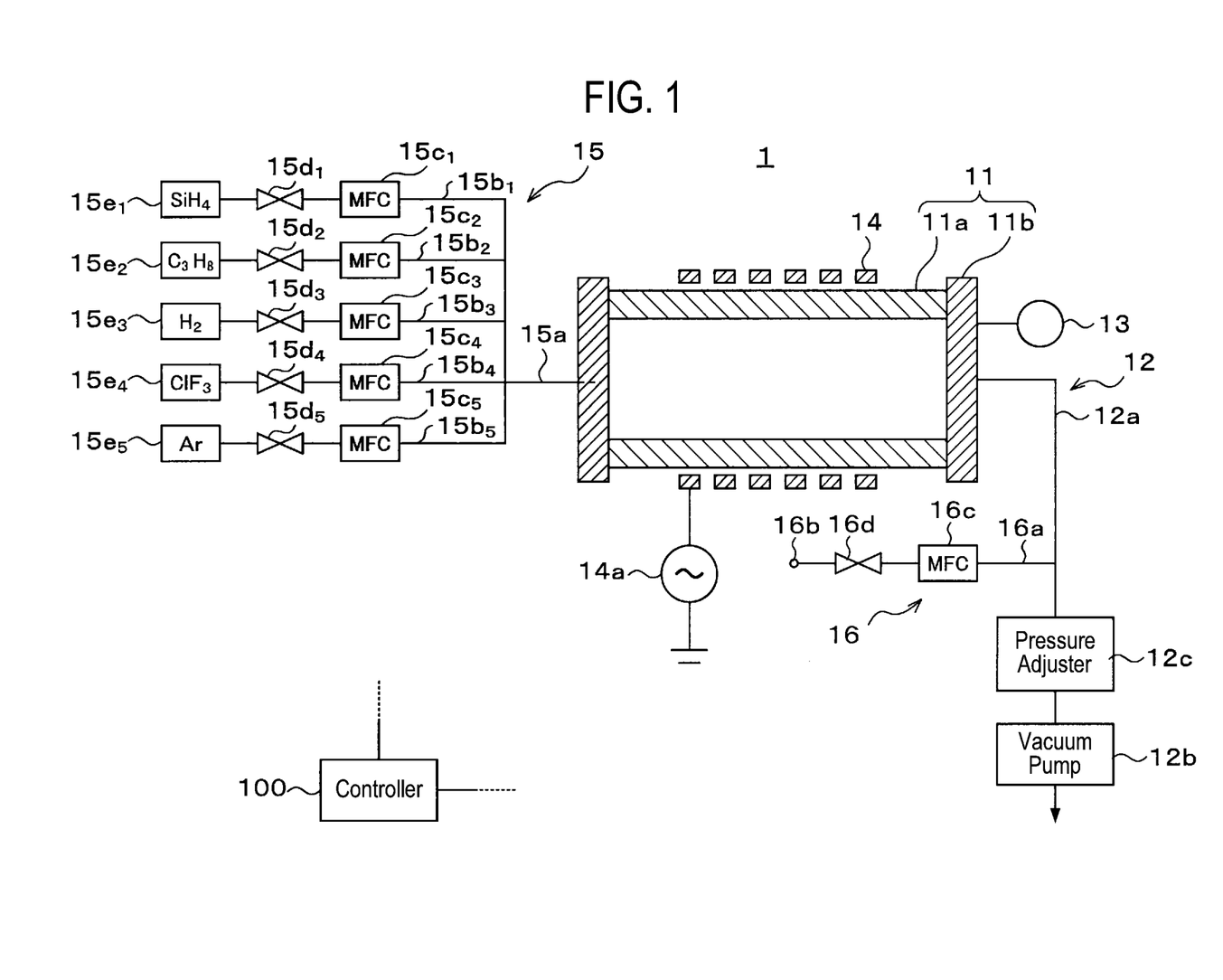
FIG. 1 is a view schematically illustrating an outline of a configuration of a film forming apparatus according to a first embodiment.

FIG. 1 is a view schematically illustrating an outline of a configuration of a film forming apparatus according to a first embodiment.

A film forming apparatus 1 in FIG. 1 includes a processing container 11 having a substantially rectangular parallelepiped shape.

An exhaust line 12 is connected to the processing container 11, and the processing container 11 can be adjusted to a desired depressurized state (pressure) by the exhaust line 12. The exhaust line 12 has an exhaust pipe 12a having one end connected to the processing container 11. The exhaust pipe 12a includes an exhaust manifold or the like, and a vacuum pump 12b including a mechanical booster pump or the like is connected to a side opposite a side of the processing container. In the exhaust pipe 12a, a pressure adjuster 12c, which is configured to adjust the pressure in the processing container 11 and includes an automatic pressure control (APC) valve, a proportional control valve, or the like, is provided between the processing container 11 and the vacuum pump 12b. In addition, the processing container 11 is provided with a pressure gauge 13, and the pressure in the processing container 11 is adjusted by the pressure adjuster 12c based on a measurement result by the pressure gauge 13.

The processing container 11 includes a processing container main body 11a having a hollow quadrangular columnar shape and having openings at opposite ends thereof, and side walls 11b connected to the opposite ends of the processing container main body 11a, respectively, so as to close the openings.

An induction coil 14 connected to a radio frequency power supply 14a is provided outside the processing container main body 11a. The induction coil 14 heats a substrate to be processed. For example, the induction coil 14 inductively heats a susceptor 23 to be described later or the like, and the substrate to be processed or the like is heated by radiant heat or heat conduction from the inductively heated susceptor 23.

A processing gas supply mechanism 15 is configured to supply a processing gas, such as a raw material gas as a raw material for film formation, into the processing container 11. The processing gas supply mechanism 15 has a gas supply pipe 15a connected to the processing container 11 and gas supply pipes $15b_1$ to $15b_5$ connected to the gas supply pipe 15a.

The gas supply pipes $15b_1$ to $15b_5$ are provided with mass flow controllers (MFC) $15c_1$ to $15c_5$ and valves $15d_1$ to $15d_5$, respectively.

A gas source $15e_1$ is connected to the gas supply pipe $15b_1$, and $SiH_4$ gas is supplied from the gas source $15e_1$ to the gas supply pipe $15b_1$. Similarly, gas sources $15e_2$ to $15e_5$ are connected to the gas lines $15b_2$ to $15b_5$, respectively, and $C_3H_8$ gas, $H_2$ gas, $ClF_3$ gas, and Ar gas are supplied from the gas sources $15e_2$ to $15e_5$ to the gas supply pipes $15b_2$ to $15b_5$, respectively.

When a SiC film is formed on a SiC substrate as a substrate to be processed through epitaxial growth, $SiH_4$ gas, $C_3H_8$ gas, and $H_2$ gas are supplied from the gas supply pipes $15b_1$ to $15b_3$ to the processing container 11, respectively, as a raw material gas for film formation.

In addition, when the processing container 11 is cleaned, one of $H_2$ gas, $ClF_3$ gas, and Ar gas from the gas supply pipes $15b_3$ to $15b_5$, respectively, is supplied to the processing container 11, or two or more of these gases are mixed and supplied to the processing container 11.

Furthermore, in the film forming apparatus 1, an air introduction mechanism 16 is connected to the exhaust pipe 12a at an upstream side of the pressure adjuster 12c in order to introduce the air into the processing container 11 during a cleaning process of the processing container 11. The air introduction mechanism 16 has a pipe 16a having one end connected to the exhaust pipe 12a and the other end having an air introduction port 16b formed therein. The pipe 16a is provided with a mass flow controller (MFC) 16c and a valve 16d in this order from a side of the exhaust pipe 12a.

A connection destination of the air introduction mechanism 16 is not limited to the exhaust pipe 12a as long as atmospheric atmosphere can be formed in the processing container 11. In addition, it is desirable that the pipe 16a is provided with a filter (not illustrated) in order to remove dust, dirt, and the like from the air.

The film forming apparatus 1 includes a controller 100. The controller 100 is, for example, a computer, and has a program storage (not illustrated). The program storage stores programs for controlling the MFCs $15c_1$ to $15c_5$, the valves $15d_1$ to $15d_5$, the radio frequency power supply 14a, the pressure adjuster 12c, and the like to perform a film forming method. The programs may be recorded in a computer-readable storage medium, and may be installed on the controller 100 from the storage medium.

Figure 2:
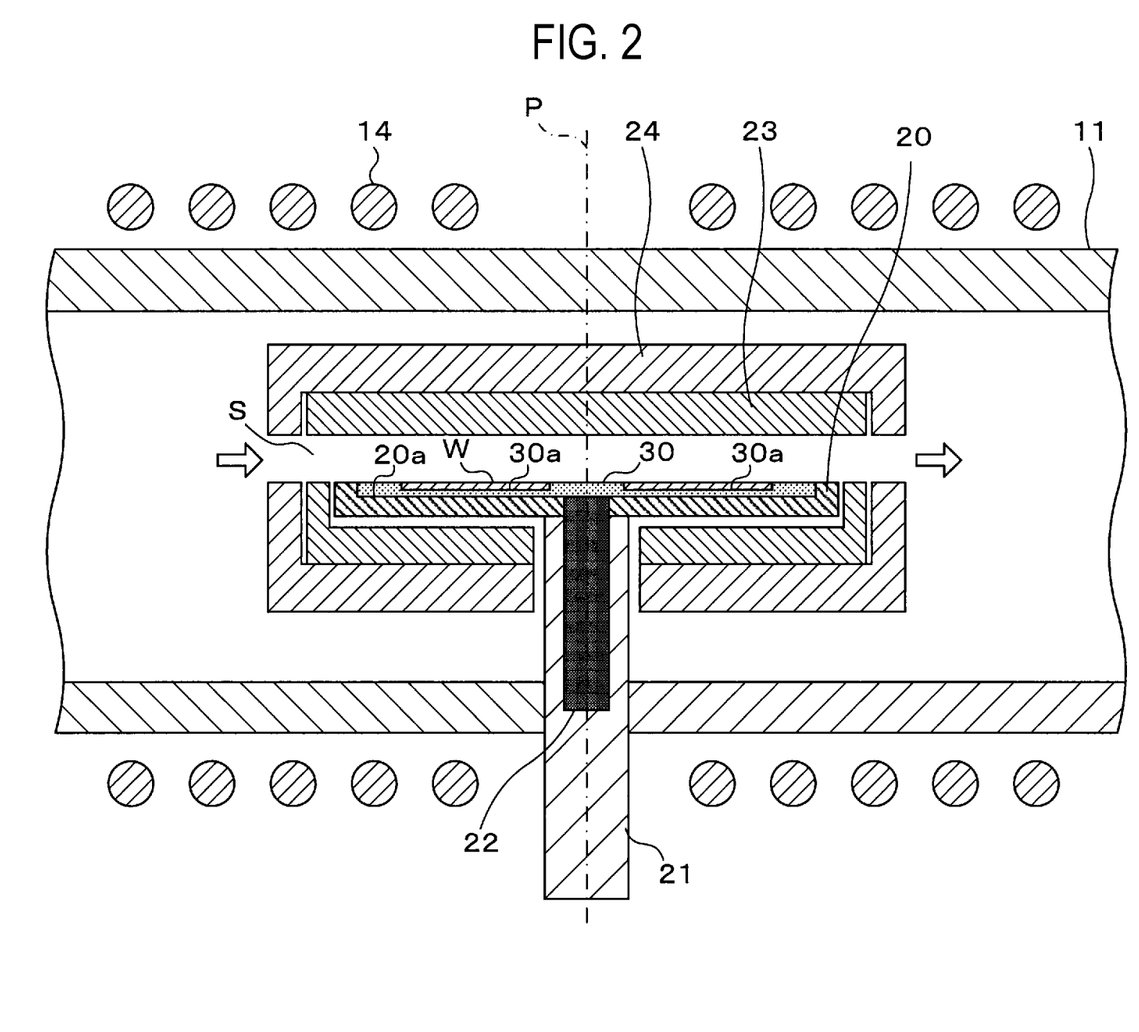
FIG. 2 is a cross-sectional view schematically illustrating an outline of a configuration inside a processing container in the film forming apparatus of FIG. 1.

Next, a configuration inside the processing container 11 will be described. FIG. 2 is a cross-sectional view schematically illustrating an outline of a configuration inside the processing container 11 in the film forming apparatus 1 of FIG. 1.

Inside the processing container 11, as illustrated in FIG. 2, a stage 20 on which a SiC substrate W (hereinafter, a substrate W) as a substrate to be processed is placed via a holder 30, and a rotary shaft 21 configured to support the stage 20 while rotating the stage 20 are provided. In addition, inside the processing container 11, a lifter 22 configured to vertically move the holder 30 holding the substrate W, and the susceptor 23 having an internal space S accommodating therein the stage 20 and configured to be inductively heated by the induction coil 14 are provided.

The stage 20 is formed in a disk shape having a recess 20a, which is formed in a top surface of the stage 20 and recessed downwards in a vertical direction, and is provided horizontally inside the processing container 11. The holder 30 is fit into the recess 20a. The holder 30 also rotates with a rotation of the stage 20 by the rotary shaft 21 about a central axis P of the stage 20 and the rotary shaft 21 by the rotary shaft 21.

The stage 20 is formed of a conductive material, which has high heat resistance and is easily heated through induction heating, and is formed by, for example, a graphite member having a top surface thereof coated with SiC.

One end of the rotary shaft 21 is connected to a lower center of the stage 20. The other end of the rotary shaft 21 penetrates and extends below a bottom of the processing container 11, and is connected to a rotational driving mechanism (not illustrated). The stage 20 rotates with a rotation of the rotary shaft 21 by the rotational driving mechanism.

The lifter 22 serves to deliver the substrate W between a transfer device for the substrate W outside the film forming apparatus 1 and the stage 20. Specifically, the lifter 22 delivers the holder 30 holding the substrate W therebetween. By moving the lifter 22 vertically by a lifting driving mechanism (not illustrated), the holder 30 is moved vertically, and accordingly, the substrate W is also moved vertically.

The susceptor 23 is formed in a rectangular parallelepiped shape having openings on two surfaces opposing each other, and has a structure in which a processing gas is supplied from the opening formed in one surface and the processing gas is discharged from the opening formed in the other surface. In this structure, the processing gas is supplied and discharged along a direction orthogonal to the central axis P of the rotary shaft 21 and parallel to a processing target surface (a top surface in the drawing) of the substrate W placed on the stage 20.

The susceptor 23 is formed of a conductive material, which has high heat resistance and is easily heated through induction heating, and is formed by, for example, a graphite member having a surface coated with SiC on a side of the substrate W.

In addition, at an outer circumference of the susceptor 23, a heat insulator 24 that insulates the susceptor 23 and the processing container 11 from each other is provided. The heat insulator 24 is formed using, for example, a fibrous carbon material having a large porosity.

In addition, although illustration is omitted, a holding structure configured to hold the heat insulator 24 in a state in which the heat insulator 24 is spaced apart from the processing container 11 is provided outside the heat insulator 24.

The holder 30 is a disk-shaped member having a diameter smaller than that of the stage 20, and is used for the purpose of collectively loading and unloading a plurality of substrates W into and from the film forming apparatus 1. The holder 30 can hold the plurality of substrates W. A plurality of placement regions 30a on which the substrates W are placed is formed on a top surface of the holder 30. The plurality of placement regions 30a is arranged at equal intervals in a circumferential direction with respect to a center of the holder 30, that is, the central axis P.

In the present embodiment, the holder 30 is formed by a member having a surface formed by a pyrolytic carbon film, in other words, a member coated with pyrolytic carbon.

More specifically, the holder 30 is formed by a graphite member having a surface, which includes the surface on which the substrates W are placed, coated with pyrolytic carbon.

Figure 3:
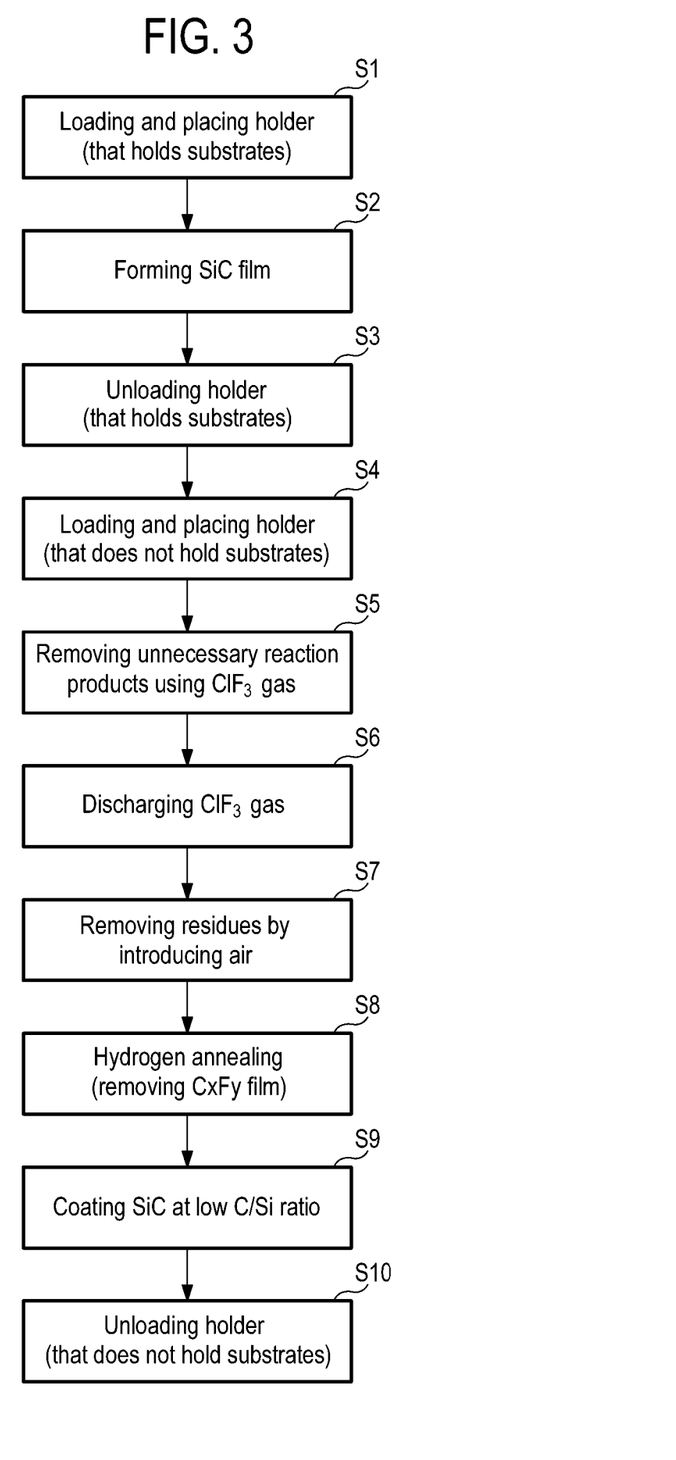
FIG. 3 is a view illustrating a flowchart for explaining an exemplary film forming method using the film forming apparatus according to the first embodiment.

Next, a film forming method using the film forming apparatus 1, which includes a process of cleaning the film forming apparatus 1, will be described. FIG. 3 is a view illustrating a flowchart for explaining an exemplary film forming method according to the first embodiment.

First, the holder 30 holding substrates W is loaded into the processing container 11 (step S1). Specifically, the holder 30 is loaded into the processing container 11 from the outside of the film forming apparatus 1 via a gate valve (not illustrated) by a transfer device (not illustrated) outside the film forming apparatus 1, and is located above the stage 20. Subsequently, the lifter 22 is moved up, whereby the holder 30 is supported by the lifter 22. Subsequently, the transfer device is retracted from the inside of the processing container 11 and the lifter 22 is moved down, whereby the holder 30 is placed on the stage 20.

After loading the holder 30, a raw material gas as a processing gas and a carrier gas are supplied from the processing gas supply mechanism 15 to the processing container 11, and the substrates W held on the holder 30 are heated. Thus, a SiC film is formed on the substrates W through epitaxial growth (step S2). Specifically, the valves $15d_1$ to $15d_3$ are opened, and $SiH_4$ gas, $C_3H_8$ gas, and $H_2$ gas are supplied into the processing container 11 while flow rates thereof are adjusted by the MFCs $15c_1$ to $15c_3$, respectively. In addition, radio frequency power is supplied from the radio frequency power supply 14a to the induction coil 14. Thus, the susceptor 23 and the stage 20 are inductively heated, and the substrates W are heated by radiation and heat conduction from the susceptor 23 and the stage 20. As a result, the SiC film is formed on the substrates W through epitaxial growth.

During the film forming process, a pressure in the processing container 11 is, for example, 10 Torr to 600 Torr, the flow rates of the $SiH_4$ gas, the $C_3H_8$ gas, and the $H_2$ gas are, for example, 10 to 600 sccm, 10 to 600 sccm, and 10 to 200 slm, respectively, and a temperature of the substrates W is, for example, 1,500 degrees C. to 1,700 degrees C. In addition, $N_2$ gas may be added to the raw material gas in case of forming the SiC film as an n-type, and trimethylaluminum (TMA) may be added to the raw material gas in case of forming the SiC film as a p-type.

After completing the film forming process, the holder 30 holding the substrates W is unloaded from the processing container 11 (step S3). Specifically, after the valves $15d_1$ to $15d_3$ are closed and the supply of the raw material gas is stopped, the lifter 22 is moved up to raise the holder 30 on which the substrates W are supported. Then, the transfer device outside the film forming apparatus 1 is inserted into the processing container 11 via the gate valve and is located below the holder 30. Thereafter, by moving the lifter 22 down, the holder 30 is delivered from the lifter 22 to the transfer device, and by retracting the transfer device from the processing container 11, the holder 30 holding the substrates W is unloaded from the processing container 11. During unloading the substrates W, the supply of the radio frequency power to the induction coil 14 may be cut off. However, it is desirable to supply the radio frequency power to the induction coil 14 such that temperatures of the stage 20 and the susceptor 23 are controlled to be an optimal values for a subsequent process.

By repeating the processing of steps S1 to S3, a SiC film having a desired thickness is formed on the substrates W.

After unloading the holder 30 holding the substrates W on which the SiC film having the desired film thickness is formed, a holder 30 that does not hold a substrate W is loaded into the processing container 11 and is placed on the stage 20 (step S4). Since the specific processing is the same as that in step S1, a description thereof is omitted. The holder 30 loaded in step S4 may hold dummy substrates having the same shape as that of the substrates W.

Thereafter, $ClF_3$ gas is supplied into the processing container 11 and unnecessary reaction products adhered to parts other than the substrates W during the film forming process are removed (step S5). Specifically, the valves $15d_4$ and $15d_5$ are opened, and $ClF_3$ gas as a fluorine-containing gas and Ar gas for dilution are supplied into the processing container 11 while flow rates thereof are adjusted by the MFCs $15c_4$ and $15c_5$, respectively. As a result, the unnecessary reaction products are removed. That is, a cleaning process is performed. During the supply of the $ClF_3$ gas, it is desirable to heat the susceptor 23 and the stage 20 by supplying radio frequency power from the radio frequency power supply 14a to the induction coil 14. During the process of removing the reaction products, the pressure in the processing container 11 is, for example, 10 Torr to 100 Torr, the flow rate of $ClF_3$ gas is, for example, 100 to 2,000 sccm, and the temperature of the susceptor 23 is, for example, 400 degrees C. to 600 degrees C.

After removing the reaction products, the $ClF_3$ gas is discharged from the processing container 11 (step S6). Specifically, the valve $15d_4$ is closed with the valve $15d_5$ in the open state, and Ar gas is supplied into the processing container 11 while the flow rate thereof is adjusted by the MFC $15c_5$. As a result, the $ClF_3$ gas in the processing container 11 is discharged.

After discharging the $ClF_3$ gas, the air is introduced into the processing container 11, whereby substances, which remain in the processing container 11 after the cleaning process using the $ClF_3$ gas and need to be removed, that is, impurities unnecessary for a subsequent film forming process and substances causing defects (hereinafter referred to as "residues") are removed (step S7). Specifically, the valve $15d_5$ is closed and the valve $16_d$ is opened, and the air is introduced into the processing container 11 while the flow rate thereof is adjusted by the MFC $16c$. As a result, the residues are removed. During the introduction of the air, the pressure in the processing container 11 is controlled to be, for example, 10 kPa to 65 kPa, and the introduction of the air is performed for 0.5 to 2.0 hours.

After removing the residues after the cleaning process, $H_2$ gas is supplied into the processing container 11 and a hydrogen annealing process is performed (step S8). Specifically, the valve $16d$ is closed and the valve $15d_3$ is opened, and $H_2$ gas is supplied into the processing container 11 while the flow rate thereof is adjusted by the MFC $15c_3$. In the hydrogen annealing process, in addition to the supply of the $H_2$ gas, radio frequency power is supplied from the radio frequency power supply 14a to the induction coil 14, so that the susceptor 23 and the like are heated. By such a hydrogen annealing process, a $C_xF_y$ film and carbon particles, which are reaction products of pyrolytic carbon and the $ClF_3$ gas and are formed on the surface of the holder 30 during the process of removing the reaction products using the $ClF_3$ gas, are removed. In addition, by the hydrogen annealing process, substances, which have not been removed in the process of removing the reaction products and in the process of removing the residues, are removed. During the hydrogen annealing process, the flow rate of the $H_2$ gas is, for example, 10 to 200 slm, and the temperature of the susceptor 23 is, for example, 1,500 degrees C. or higher. In addition, the hydrogen annealing process is performed for 0.5 to 2.0 hours. A time required for the hydrogen annealing process can be shortened by increasing the temperature of the susceptor 23.

After the hydrogen annealing process, a raw material gas is supplied into the processing container 11 at a low C/Si ratio, and a SiC film is formed on the surface of the holder 30. In other words, the surface of the holder 30 is coated with SiC (step S9). Specifically, with the valves $15d_3$ maintained in the open state, the valves $15d_1$ and $15d_2$ are opened and flow rates are adjusted by the MFCs $15c_1$ and $15c_2$, whereby $SiH_4$ gas, $C_3H_8$ gas, and $H_2$ gas are supplied into the processing container 11. By this process, for example, a SiC film of about 5 to 10 μm is formed on the surface of the holder 30 on which the substrates W are to be placed. In addition, by this process, the surfaces of the susceptor 23 or the stage 20 are coated with SiC.

In the process of coating the SiC film, the pressure in the processing container 11 is, for example, 10 Torr to 600 Torr, the flow rates of the $SiH_4$ gas, the $C_3H_8$ gas, and the $H_2$ gas are, for example, 10 to 600 sccm, 10 to 600 sccm, and 100 to 150 slm, respectively, and the temperature of the susceptor 23 is, for example, 1,600 degrees C. to 1,700 degrees C. More specifically, the flow rates of the $SiH_4$ gas and the $C_3H_8$ gas are adjusted such that the C/Si ratio becomes 0.5, for example, for the first few minutes, and subsequently, the flow rate of the $C_3H_8$ gas is increased such that the C/Si ratio becomes 0.8. After increasing the flow rate of the $C_3H_8$ gas, a SiC film having a desired film thickness can be formed on the surface of the holder 30 or the like by maintaining the supply of the $SiH_4$ gas and the $C_3H_8$ gas for, for example, 30 minutes.

In the process of coating the SiC film, by setting the C/Si ratio at the start of the SiC film formation to be low, for example, 0.5, as described above, it is possible to enhance adhesion of pyrolytic carbon of the holder 30 and the SiC film formed in the coating process. In addition, during the film formation, the flow rates of the $SiH_4$ gas and the $C_3H_8$ gas are adjusted such that the C/Si ratio is 1.0 to 1.4.

After coating the SiC, the holder 30, which does not hold substrates W and has been coated with SiC, is unloaded from the processing container 11 (step S10). Since the specific processing is the same as that in step S3, a description thereof is omitted.

After step S10, the process is returned to step S1, and the holder 30 on which substrates W are placed is loaded into the processing container 11, and the processes of steps S1 to S10 are repeated.

In addition, the holder 30, which is loaded into the processing container 11 and places the substrates W thereon, has been pre-coated with SiC in a previous execution of the film forming method. When the holder 30 is used for the film formation for the first time, the surface of the holder 30 is pre-coated with SiC through the same process as in step S9 in advance.

As described above, in the present embodiment, during the cleaning process using $ClF_3$ gas, the holder 30 is placed on the stage 20, and the surface of the holder 30 is formed by pyrolytic carbon having higher resistance to the $ClF_3$ gas compared to SiC. Therefore, it is possible to extend the lifespan of the holder 30, which is used in both the cleaning process using $ClF_3$ gas and the film forming process. Since pyrolytic carbon has also high heat resistance, the holder 30 can be used in a high-temperature process. In addition, in the present embodiment, since the surface of the holder 30 is formed by pyrolytic carbon, $ClF_3$ gas is not consumed by reaction with the surface of the holder 30 during the cleaning process using $ClF_3$ gas. Therefore, it is possible to improve efficiency of the cleaning process using $ClF_3$ gas. In order to reduce consumption of expensive $ClF_3$ gas, unnecessary reaction products adhered to the surface of the holder 30 may be removed in advance by polishing or the like before the holder 30 is loaded into the processing container 11 at the time of the cleaning process. In addition, according to the present embodiment, since $ClF_3$ gas is not consumed by the reaction with the surface of the holder 30 formed by pyrolytic carbon, a total flow rate of the cleaning gas using $ClF_3$ gas can be suppressed, whereby damage to members on the upstream side of the holder 30 can be suppressed. Therefore, it is possible to extend lifespans of the members on the upstream side of the holder 30.

In addition, in the present embodiment, after the cleaning process using $ClF_3$ gas, the raw material gas of the SiC film is supplied at a low C/Si ratio, and the SiC film is formed (pre-coated) on the surface of the holder 30. Here, unlike the present embodiment, a case where the holder 30 is not pre-coated with a SiC film is considered. In this case, SiC, which has been adhered to the holder 30 in a powder form during the film forming process using the holder 30, may peel off from the holder 30 and may cause defects. In contrast, in the present embodiment, the SiC film is pre-coated on the holder 30 with good adhesion. Since the SiC on the holder 30 does not peel off from the holder 30 due to the good adhesion between the pre-coated film and pyrolytic carbon, it is possible to suppress occurrence of defects.

In the present embodiment, after the cleaning process using $ClF_3$ gas, a $C_xF_y$ film, which is a reaction product of the pyrolytic carbon of the holder 30 and the $ClF_3$ gas, is removed from the surface of the holder 30. In a case where the $C_xF_y$ film is not removed unlike the present embodiment, when the SiC film is formed or pre-coated by using the holder 30 from which no $C_xF_y$ film has been removed, the $C_xF_y$ film peels off due to film stress or the like, which may cause defects. In contrast, in the present embodiment, since the $C_xF_y$ film is removed as described above, occurrence of defects caused by the $C_xF_y$ film can be suppressed.

In addition, in the present embodiment, since the holder 30 is configured by a member having a surface formed of pyrolytic carbon, a $C_xF_y$ film is formed during the cleaning process using $ClF_3$ gas. However, the $C_xF_y$ film can be removed through the hydrogen annealing process in the film forming apparatus 1. In the present embodiment, the cleaning process using $ClF_3$ gas, removing the reaction products of $ClF_3$ gas and the holder 30, and the pre-coating SiC on the holder 30 may be continuously performed.

In the present embodiment, pre-coating the SiC film on the holder 30 is performed in parallel with coating surfaces of the susceptor 23 and the stage 20 with SiC, which is an existing process. In addition, removing the $C_xF_y$ film is also performed in parallel with a process of removing substances that have not be removed in the process of removing reaction products and the process of removing residues, which are existing processes. That is, the film forming method according to the present embodiment does not require additional processes.

In the present embodiment, since $ClF_3$ gas is supplied into the processing container 11 after the film forming process, it is possible to remove a wide variety of unnecessary reaction products in the film forming apparatus 1. In particular, during the removal of the reaction products, only the susceptor 23 and the stage 20 are selectively heated through induction heating. Therefore, it is possible to remove deposits having different characteristics at the same time with a single process, for example, by removing, at a high temperature, rigid 3C-SiC polycrystals grown on the stage 20 and removing, at a low temperature, deposits that easily react with $ClF_3$ gas, such as Si and Si-rich dendritic products adhered to the vicinity of the gas introduction port of the susceptor 23 and $SiH_x$ adhered to the exhaust pipe 12a.

In addition, in the removal process using $ClF_3$ gas, there is no significant deterioration in the heat insulator 24, the processing container 11, and the like. The reason is that, in the film forming apparatus 1, only the susceptor 23 and the stage 20 can be selectively heated through induction heating.

In addition, in the present embodiment, after the process of removing the reaction products using $ClF_3$ gas, the air is introduced into the processing container 11 to remove the residues. The residues react with moisture in the air and are discharged from the processing container 11.

Since the residues are removed as described above, it is possible to significantly reduce an amount of unnecessary impurities and defects in the SiC film formed thereafter.

In addition, in the present embodiment, substances that cannot be removed through the process of removing the residues by introducing the air are removed through the hydrogen annealing process.

Therefore, it is possible to further reduce the amount of unnecessary impurities and defects in the SiC film formed thereafter.

(Confirmation Test 1)

A test was conducted, in which a graphite test piece having a surface coated with pyrolytic carbon (hereinafter, referred to as "Test Piece 1"), and a graphite test piece having a surface coated with SiC (hereinafter, referred to as "Test Piece 2"), were exposed to $ClF_3$ gas and changes in weight before and after the exposure were examined. In this test, a temperature of each test piece was set to 590 degrees C.

According to this test, a mass of Test Piece 1 was 45.282 g before exposure and 45.277 g after exposure, and a mass change rate was $1.0 \times 10^{-4}$ $g/cm^2$.

Meanwhile, a mass of Test Piece 2 was 9.732 g before the exposure and 9.198 g after the exposure, and a mass change rate was $6.8 \times 10^{-3}$ $g/cm^2$.

From this test result, it can also be confirmed that pyrolytic carbon has a resistance to $ClF_3$ gas about 70 times higher than that of SiC.

(Confirmation Test 2)

With respect to Test Piece 1, a test, in which an exposure process to $ClF_3$ gas, a hydrogen annealing process similar to that in step S8, a SiC coating process similar to that in step S9, a SiC film forming process similar to that in step S2, and an exposure process to $ClF_3$ gas were sequentially performed, was conducted and a change in weight was examined. At that time, the surface of Test Piece 1 was observed by an optical microscope. A SiC film having a thickness of about 150 μm was formed by repeatedly performing a SiC film forming process similar to that in steps S1 to S3.

According to this test, the mass of Test Piece 1 was 45.263 g in an initial state before the exposure process to $ClF_3$ gas, 48.219 g after the SiC film forming process, and 45.284 g after the final exposure process to $ClF_3$ gas. In addition, according to an observation result by the optical microscope or by eye, after the final exposure process to $ClF_3$ gas, the surface of Test Piece 1 returned to the initial state (the state before the first exposure process to $ClF_3$ gas). From this result, it can be confirmed that only the SiC film was etched in Test Piece 1 during the final exposure process to $ClF_3$ gas. That is, by configuring the holder 30 by a graphite member having a surface coated with pyrolytic carbon, unlike a case where the holder is formed by a graphite member coated with SiC, ClF$_3$ gas is not consumed when etching of a base material of the holder 30. Since the ClF$_3$ gas that is not consumed is used for cleaning the susceptor 23, utilization efficiency of ClF$_3$ gas can be improved.

In this test, it was confirmed that SiC was formed on Test Piece 1 with good adhesion by the same SiC coating process as that in step S9, instead of being formed in a powdery state. In addition, in this test, it was confirmed that, through the SiC film forming process similar to that in step S2, a film equivalent to that formed in the case where the holder is formed by a graphite member coated with SiC was formed on Test Piece 1.

Second Embodiment

In the first embodiment, the holder 30 is formed by a graphite member having a surface coated with pyrolytic carbon.

In contrast, in the present embodiment, the holder 30 is formed by a bulk material of pyrolytic carbon. Other components of the film forming apparatus 1 and the film forming method including the cleaning process in the present embodiment are the same as those in the first embodiment.

The present embodiment has the following effects in addition to the effects of the first embodiment.

According to the present embodiment, it is possible to further extend the lifespan of the holder 30.

In addition, the holder 30 of the present embodiment has high resistance to stress generated between the holder 30 and the SiC film formed during the pre-coating or film forming process, and thus warpage due to the above-mentioned stress does not occur. Therefore, the holder 30 of the present embodiment is more suitable for the film formation than that of the first embodiment.

In addition, since the bulk material of pyrolytic carbon contains almost no impurities that serve as dopants for a SiC film, there is little concern that unnecessary impurities will be mixed into a formed SiC film.

Furthermore, the bulk material of pyrolytic carbon has anisotropy in thermal conductivity and has thermal conductivities of 345 W/mk (in a plane direction at room temperature) and 1.7 W/mk (in a thickness direction at room temperature). Therefore, heat conducted from the susceptor 23 and the stage 20 is made uniform in a plane by the holder 30 of the present embodiment, and is transferred to the substrates W. Therefore, according to the present embodiment, it is possible to improve in-plane uniformity of a temperature distribution of the substrates W.

By improving the in-plane uniformity of the temperature distribution of the substrates W as described above, it is possible to reduce the number of defects in a SiC film formed on the substrates W. The reason is that, triangular defects and the like are likely to occur in a low-temperature portion, but by improving the in-plane uniformity of the temperature distribution of the substrates W, it is possible to prevent low-temperature portions from being generated in the substrates W. In addition, the low-temperature portions are likely to occur in portions of the substrates W located on an outer circumferential portion of a stage 20.

(Confirmation Test 3)

Figure 4:
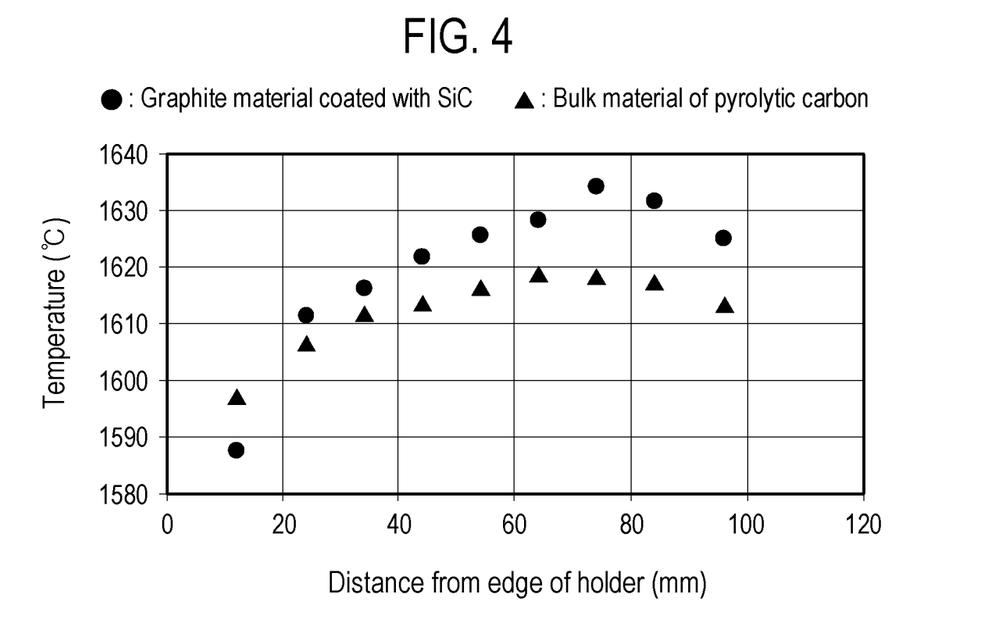
FIG. 4 is a view showing a result of an evaluation test about a temperature distribution of substrates, which was conducted by the present inventors.

In Confirmation Test 3, in each of a case of using a bulk material of pyrolytic carbon as a member constituting the holder and a case of using a graphite member having a surface coated with SiC as a member constituting the holder, substrates W were etched using H$_2$ gas. Then, for each member used for the holder, a difference in temperature distribution was confirmed from a distribution of an etched amount. The result of Confirmation Test 3 are shown in FIG. 4. A structure of the film forming apparatus used in Confirmation Test 3 other than the holder is the same as the structure illustrated in FIGS. 1 and 2. A diameter of the holder was set to 300 mm.

As shown in FIG. 4, in the case of using the graphite member having the surface coated with SiC for the holder, the maximum temperature difference of the substrates W among inner and outer portions of the holder was about 50 degrees C., which is large.

In contrast, in the case of using the bulk material of pyrolytic carbon for the holder, the maximum temperature difference of the substrates W among inner and outer portions of the holder was about 20 degrees C., which is small.

From the result of Confirmation Test 3, it can be confirmed that the film forming apparatus of the present embodiment is capable of improving the in-plane uniformity of the temperature distribution of the substrates W.

Third Embodiment

Figure 5:
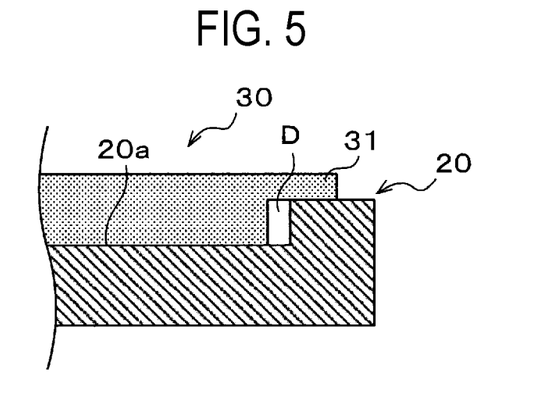
FIG. 5 is a partial cross-sectional view schematically illustrating an outline of a holder included in a film forming apparatus according to a third embodiment.

FIG. 5 is a partial cross-sectional view schematically illustrating an outline of a holder 30 included in the film forming apparatus according to the third embodiment.

As illustrated in FIG. 5, in the present embodiment, the holder 30 has a flange 31 on an outer circumference thereof. The flange 31 covers a gap D between a side wall defining the recess 20a and the holder 30 when the holder 30 is placed in the recess 20a of the stage 20.

When the flange 31 is not provided, during the cleaning process using ClF$_3$ gas, SiC adhered to the susceptor 23 on the upper side may gradually become smaller and the adhesion to the susceptor 23 may decrease. Thus, the SiC may fall from the susceptor 23 and enter the gap D. Since it is difficult for the ClF$_3$ gas to flow into the gap D, it is difficult to remove the SiC, which has entered the gap D, using the ClF$_3$ gas.

In the present embodiment, since the flange 31 is provided, it is possible to prevent generation of particles due to the SiC that has entered the gap D.

(Modifications of First to Third Embodiments)

In the foregoing examples, the holder 30 are commonly used during of the film forming process and during the cleaning process. In other words, the plate-shaped member placed on the stage 20 during the cleaning process also served as a holder during the film forming process. However, a plate-shaped member configured in the same manner as the holder 30 of each of the embodiments described above may be used only during the cleaning process, and a holder formed by, for example, a graphite member having a surface coated with SiC may be used during the film forming process. However, when the plate-shaped member placed on the stage 20 during the cleaning process also serves as a holder during the film forming process, the following effects can be achieved. That is, unnecessary reaction products formed on the holder during the cleaning process using ClF$_3$ gas can be removed, and cause of particles generated during the film forming process can be reduced. In addition, it is not necessary to design a plate-shaped member for the cleaning process only. The "plate-shaped member configured in the same manner as the holder 30 of each of the embodiments" described above is specifically, for example, a graphite member having a surface coated with pyrolytic carbon or a plate-shaped member formed by a bulk material of pyrolytic carbon, and is a member having substantially the same shape as the holder 30.

In the foregoing examples, the stage 20 and the susceptor 23 are formed by a graphite member coated with SiC. Alternatively, the stage 20 or the susceptor 23 may be formed by a graphite member having a surface coated with pyrolytic carbon. As a result, the lifespans of the stage 20 and the susceptor 23 can be extended.

In the foregoing examples, the hydrogen annealing process of step S8 and the pre-coating process of step S9 are performed after the process of removing residues by introducing the air in step S7, but may be performed before the process of removing residues.

In the foregoing examples, $ClF_3$ gas is used to remove unnecessary reaction products adhered during the film forming process, but other fluorine-containing gases, such as ClF gas and $ClF_5$ gas, may be used.

In the foregoing examples, the raw material gas supplied onto the substrates W are supplied and discharged along a direction parallel to the substrates W. However, each of the above embodiments is also applicable to film formation using a film forming apparatus in which a raw material gas is supplied along a direction perpendicular to the substrates W.

It should be understood that the embodiments disclosed herein are illustrative and are not limited in all aspects. The embodiments described above may be omitted, replaced, or modified in various forms without departing from the scope and spirit of the appended claims.

In addition, the following configurations also fall within the technical scope of the present disclosure.

(1) A film forming method of forming a silicon carbide film on a substrate to be processed, the method including:
   forming the silicon carbide film on the substrate to be processed by loading a holder that holds the substrate to be processed into a processing container of a film forming apparatus to place the holder on a stage, and supplying a raw material gas into the processing container; and
   removing a reaction product, which has been adhered to a part other than the substrate to be processed during the forming the silicon carbide film, by loading a plate-shaped member having at least a surface formed by pyrolytic carbon into the processing container to place the plate-shaped member on the stage, and supplying a fluorine-containing gas into the processing container.

According to (1), since at least the surface of the plate-shaped member placed on the stage is formed by pyrolytic carbon having high resistance to the fluorine-containing gas supplied when removing unnecessary reaction products, it is possible to extend the lifespan of the plate-shaped member. In addition, since at least the surface of the plate-shaped member is formed by pyrolytic carbon, the fluorine-containing gas is not consumed by a reaction with the plate-shaped member. Thus, it is possible to improve efficiency of cleaning using the fluorine-containing gas. Furthermore, since the fluorine-containing gas is not consumed by a reaction with the plate-shaped member formed by pyrolytic carbon, it is possible to suppress a total flow rate of a cleaning gas using the fluorine-containing gas, and to suppress damage to members on an upstream side of the stage. Therefore, the lifespans of the members on the upstream side can be extended.

(2) The film forming method set forth in (1), wherein the stage has a recess in which the holder is placed,
   wherein the plate-shaped member has a flange at an outer circumference of the plate-shaped member, and
   wherein the flange covers a gap between a side wall defining the recess and the plate-shaped member when the plate-shaped member is placed in the recess.

According to (2), it is possible to prevent generation of particles due to silicon carbide that has entered the gap.

(3) The film forming method set forth in (1) or (2), wherein the forming the silicon carbide film includes forming the silicon carbide film by using the holder having a surface formed by silicon carbide.

(4) The film forming method set forth in (1) or (2), wherein the plate-shaped member used in the removing the adhered reaction product also serves as the holder used in the forming the silicon carbide film.

(5) The film forming method set forth in (4), further including:
   removing a reaction product of the fluorine-containing gas and the pyrolytic carbon that forms the surface of the plate-shaped member, after the removing the adhered reaction product.

According to (5), it is possible to suppress occurrence of defects caused by the reaction product of the fluorine-containing gas and the pyrolytic carbon that forms the surface of the plate-shaped member.

(6) The film forming method set forth in (4) or (5), further including:
   forming a silicon carbide film on the surface of the plate-shaped member after the removing the adhered reaction product.

According to (6), when the plate-shaped member is used as a holder during film formation, the SiC formed on the plate-shaped member during the film formation does not peel off from the plate-shaped member. Thus, it is possible to suppress occurrence of defects.

(7) The film forming method set forth in any one of (1) to (6), wherein the stage is configured such that a pyrolytic carbon film is formed on a surface of a graphite member.

(8) A film forming apparatus for forming a silicon carbide film on a substrate to be processed, the apparatus including:
   a processing container configured such that a pressure in the processing container is capable of being depressurized;
   a stage disposed in the processing container and configured to place the substrate to be processed on the stage via a holder that holds the substrate to be processed;
   a processing gas supply mechanism configured to supply a processing gas into the processing container; and
   a plate-shaped member configured by a bulk material of pyrolytic carbon,
   wherein the plate-shaped member is placed on the stage when a reaction product, which has been adhered to a part other than the substrate to be processed during film formation, is removed by supplying a fluorine-containing gas from the processing gas supply mechanism into the processing container.

(9) The film forming apparatus set forth in (8), wherein the stage has a recess in which the holder is placed,
   wherein the plate-shaped member has a flange at an outer circumference of the plate-shaped member, and
   wherein the flange covers a gap between a side wall defining the recess and the plate-shaped member when the plate-shaped member is placed in the recess.

(10) The film forming apparatus of (8) or (9), wherein the plate-shaped member also serves as the holder.

EXPLANATION OF REFERENCE NUMERALS

1: film forming apparatus, 2: processing container, 15: processing gas supply mechanism, 20: stage, 30: holder, W: substrate.

What is claimed is:

1. A film forming method of forming a silicon carbide film on a substrate to be processed, the method comprising:
   forming the silicon carbide film on the substrate to be processed by loading a holder that holds the substrate to be processed into a processing container of a film forming apparatus to place the holder on a stage, and supplying a raw material gas into the processing container;
   unloading the holder from the processing container;
   removing a reaction product, which has been adhered to a part other than the substrate to be processed during the forming the silicon carbide film, by loading a plate-shaped member having at least a surface formed by pyrolytic carbon into the processing container to place the plate-shaped member on the stage, and supplying a fluorine-containing gas into the processing container;
   after the removing the adhered reaction product, forming a silicon carbide film having a desired film thickness on the surface of the plate-shaped member by supplying the raw material gas into the processing container; and
   unloading the plate-shaped member from the processing container when the silicon carbide film having the desired film thickness is formed on the plate-shaped member,
   wherein the plate-shaped member used in the removing the adhered reaction product also serves as the holder used in the forming the silicon carbide film on the substrate to be processed, and
   wherein in the forming the silicon carbide film having the desired film thickness on the surface of the plate-shaped member, a C/Si ratio of the raw material gas is maintained to be lower than that in the forming the silicon carbide film on the substrate to be processed until the silicon carbide film having the desired film thickness is formed on the plate-shaped member.

2. The film forming method of claim 1, wherein the stage has a recess in which the holder is placed,
   wherein the plate-shaped member has a flange at an outer circumference of the plate-shaped member, and
   wherein the flange covers a gap between a side wall defining the recess and the plate-shaped member when the plate-shaped member is placed in the recess.

3. The film forming method of claim 2, wherein the forming the silicon carbide film on the substrate to be processed includes forming the silicon carbide film by using the holder having a surface formed by silicon carbide.

4. The film forming method of claim 1, further comprising:
   after the removing the adhered reaction product and before the forming the silicon carbide film on the surface of the plate-shaped member, removing a reaction product of the fluorine-containing gas and the pyrolytic carbon that forms the surface of the plate-shaped member.

5. The film forming method of claim 1, wherein the stage is configured such that a pyrolytic carbon film is formed on a surface of a graphite member.

6. The film forming method of claim 1, wherein the forming the silicon carbide film on the substrate to be processed includes forming the silicon carbide film by using the holder having a surface formed by silicon carbide.

7. The film forming method of claim 1, wherein the forming the silicon carbide film on the surface of the plate-shaped member includes:
   supplying the raw material gas into the processing container while the C/Si ratio of the raw material gas is set to be a first value;
   increasing the C/Si ratio of the raw material gas from the first value to a second value, which is lower than the C/Si ratio of the raw material gas in the forming the silicon carbide film on the substrate to be processed; and
   supplying the raw material gas into the processing container while the C/Si ratio of the raw material gas is maintained to be the second value, until a desired thickness of the silicon carbide film is formed on the plate-shaped member.

8. The film forming method of claim 7, wherein the first value and the second value of the C/Si ratio of the raw material gas in the forming the silicon carbide film on the surface of the plate-shaped member are 0.5 and 0.8, respectively, and
   wherein the C/Si ratio of the raw material gas in the forming the silicon carbide film on the substrate to be processed ranges from 1.0 to 1.4.

* * * * *